United States Patent
Simon et al.

(10) Patent No.: US 11,855,441 B2
(45) Date of Patent: Dec. 26, 2023

(54) SYSTEM AND METHOD FOR CONTROLLING AN ELECTRICAL RECEPTACLE

(71) Applicant: Hubbell Incorporated, Shelton, CT (US)

(72) Inventors: Robert Simon, Shelton, CT (US); Matthew Samojeden, Rye, NY (US)

(73) Assignee: Hubbell Incorporated, Shelton, CT (US)

( * ) Notice: Subject to any disclaimer, the term of this patent is extended or adjusted under 35 U.S.C. 154(b) by 269 days.

(21) Appl. No.: 16/625,060

(22) PCT Filed: Jul. 13, 2018

(86) PCT No.: PCT/US2018/042067
§ 371 (c)(1),
(2) Date: Dec. 20, 2019

(87) PCT Pub. No.: WO2019/014579
PCT Pub. Date: Jan. 17, 2019

(65) Prior Publication Data
US 2020/0153231 A1 May 14, 2020

Related U.S. Application Data

(60) Provisional application No. 62/532,132, filed on Jul. 13, 2017.

(51) Int. Cl.
*H02H 3/20* (2006.01)
*G01R 19/155* (2006.01)
(Continued)

(52) U.S. Cl.
CPC ........... *H02H 3/202* (2013.01); *G01R 19/155* (2013.01); *G01R 27/08* (2013.01); *H02H 1/0007* (2013.01)

(58) Field of Classification Search
CPC ........ H02H 3/202; H02H 3/13; H02H 1/0007; G01R 19/155; G01R 27/08
(Continued)

(56) References Cited

U.S. PATENT DOCUMENTS 5,003,486 A * 3/1991 Hendel ................... H02H 3/00
324/525
5,708,551 A * 1/1998 Bosatelli .................. H02H 3/12
361/62

(Continued)

FOREIGN PATENT DOCUMENTS

EP 0581078 2/1994

OTHER PUBLICATIONS

European Patent Application No. 18831228 Supplementary Search Report and Search Opinion dated Feb. 26, 2021.
(Continued)

*Primary Examiner* — Thienvu V Tran
*Assistant Examiner* — Sreeya Sreevatsa
(74) *Attorney, Agent, or Firm* — Michael Best & Friedrich LLP

(57) ABSTRACT

An electrical receptacle including an outlet for electrically connecting to an external load, a load terminal electrically connected to the outlet, a line terminal electrically connected to a line and configured to receive line power, an interrupting device, and a testing circuit. The interrupting device electrically connects the load terminal to the line terminal when in a first condition and electrically disconnects the load terminal and the line terminal when in a second condition. The testing circuit is configured to determine when the external load is electrically connected to the outlet, and place the interrupting device in the first condition when the external load is electrically connected to the outlet.

6 Claims, 5 Drawing Sheets

(51) Int. Cl.
*G01R 27/08* (2006.01)
*H02H 1/00* (2006.01)

(58) Field of Classification Search
USPC .......................................... 361/86
See application file for complete search history.

(56) References Cited

U.S. PATENT DOCUMENTS

| | | | | |
|---|---|---|---|---|
| 2004/0164721 | A1* | 8/2004 | Kwatra | G05F 1/468 |
| | | | | 323/286 |
| 2007/0086126 | A1* | 4/2007 | Baxter | H02H 11/005 |
| | | | | 361/42 |
| 2008/0049367 | A1* | 2/2008 | Carson | H02H 3/12 |
| | | | | 361/87 |
| 2009/0102294 | A1* | 4/2009 | Hodges | H02J 9/005 |
| | | | | 307/131 |
| 2012/0056492 | A1* | 3/2012 | Carson | H02H 3/12 |
| | | | | 307/116 |

OTHER PUBLICATIONS

PCT/US2018/042067 International Search Report and Written Opinion dated Sep. 20, 2018.

* cited by examiner

SYSTEM AND METHOD FOR CONTROLLING AN ELECTRICAL RECEPTACLE

RELATED APPLICATIONS

This application claims the benefit to U.S. Provisional Patent Application No. 62/532,132, filed on Jul. 13, 2017, the entire contents of which are incorporated herein by reference.

FIELD

Embodiments relate to electrical receptacles.

SUMMARY

Electrical receptacles, such as ground fault circuit interrupters (GFCI) receptacles, are configured to provide electrical power to an external load via an outlet.

In one embodiment, the application provides an electrical receptacle including an outlet for electrically connecting to an external load, a load terminal electrically connected to the outlet, a line terminal electrically connected to a line and configured to receive line power, an interrupting device, and a testing circuit. The interrupting device electrically connects the load terminal to the line terminal when in a first condition and electrically disconnects the load terminal and the line terminal when in a second condition. The testing circuit is configured to determine the external load is electrically connected to the outlet, and place the interrupting device in the first condition when the external load is electrically connected to the outlet.

In another embodiment the application provides a method of controlling an electrical receptacle. The method includes outputting, via a controller, a test signal and receiving, via the controller, a response signal. The method further includes analyzing, via the controller, the response signal and determining, based on the analysis of the response signal, if an acceptable external load is electrically connected to a outlet. The method further includes controlling an interrupting device based on the determination.

Other aspects of the application will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
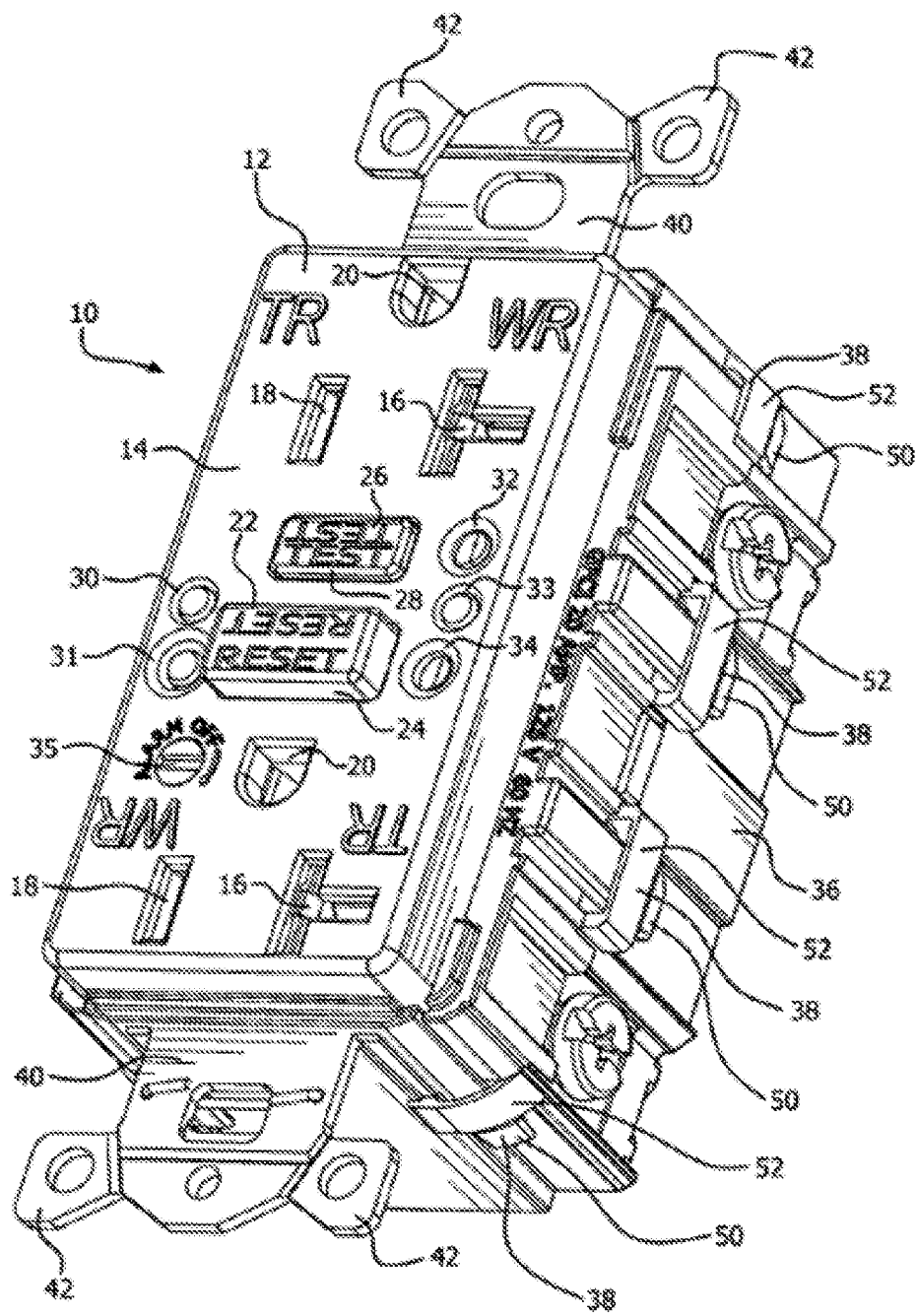
FIG. 1 is a perspective view of an electrical receptacle according to some embodiments.

FIG. 1 illustrates a perspective view of a receptacle 10 according to one embodiment of the invention. In some embodiments, the receptacle 10 is a ground fault circuit interrupter (GFCI) device. In some embodiments, the receptacle 10 is configured to provide 120 VAC and/or 220 VAC. In some embodiments, the receptacle 10 may include a Universal Serial Bus (USB) outlet or other direct current (DC) outlet.

The receptacle 10 includes a front cover 12 having a duplex outlet face 14 with a phase opening 16, a neutral opening 18, and a ground opening 20. The face 14 further has opening 22, accommodating a RESET button 24, an adjacent opening 26, accommodating a TEST button 28, and six respective circular openings 30-35. In some embodiments, openings 30 and 33 accommodate two respective indicators, such as but not limited to, various colored light-emitting diodes (LEDs). In some embodiments, openings 32 and 34 accommodate respective bright LEDs used, for example, as a nightlight. In some embodiments, opening 31 accommodates a photoconductive photocell used, for example, to control the nightlight LEDs. In some embodiments, opening 35 provides access to a set screw for adjusting a photocell device or a buzzer (e.g., buzzer 605 described in more detail below) in accordance with this, as well as other, embodiments.

The receptacle 10 further includes a rear cover 36 secured to the front cover 12 by eight fasteners 38 (four fasteners 38 are shown in FIG. 1, while the other four fasteners 38 are obstructed from view). In some embodiments, the fasteners 38 include a barbed post 50 on the front cover 12 and a corresponding resilient hoop 52 on the rear cover 36, similar to that which is described in detail in U.S. Pat. No. 6,398,594, the entire contents of which are incorporated herein by reference for all that is taught. A ground yoke/bridge assembly 40 includes standard mounting ears 42 protruding from the ends of the receptacle 10.

Figure 2:
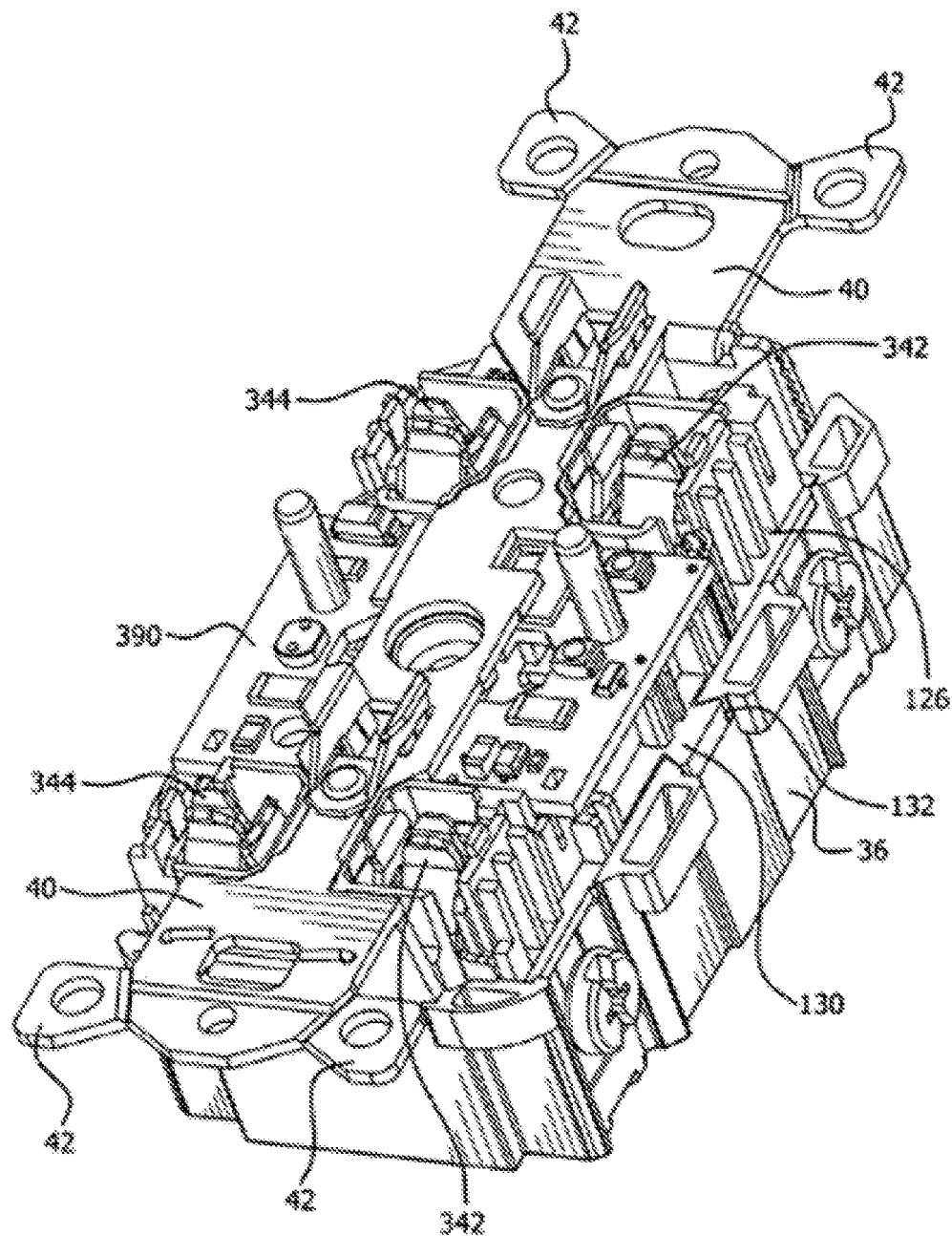
FIG. 2 is a partially exposed view of the electrical receptacle of FIG. 1 according to some embodiments.

FIG. 2 illustrates a perspective view of the receptacle 10 with the front cover 12 removed to expose manifold 126. Manifold 126 provides support for a printed circuit board 390 and the yoke/bridge assembly 40. According to one embodiment, manifold 126 includes four dovetail interconnects 130 that mate with corresponding cavities 132 along an upper edge of the rear cover 36. One dovetail-cavity pair is provided on each of the four sides of manifold 126 and rear cover 36, respectively.

Figure 3:
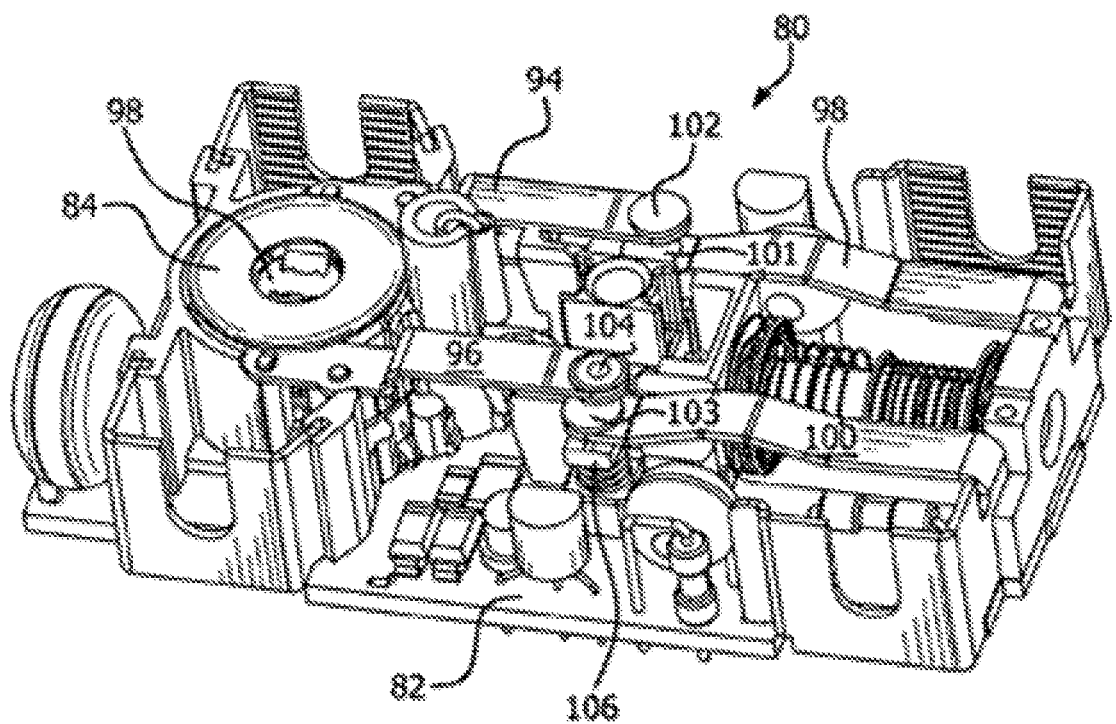
FIG. 3 is a partially exposed view of the electrical receptacle of FIG. 1 according to some embodiments.
Figure 4:
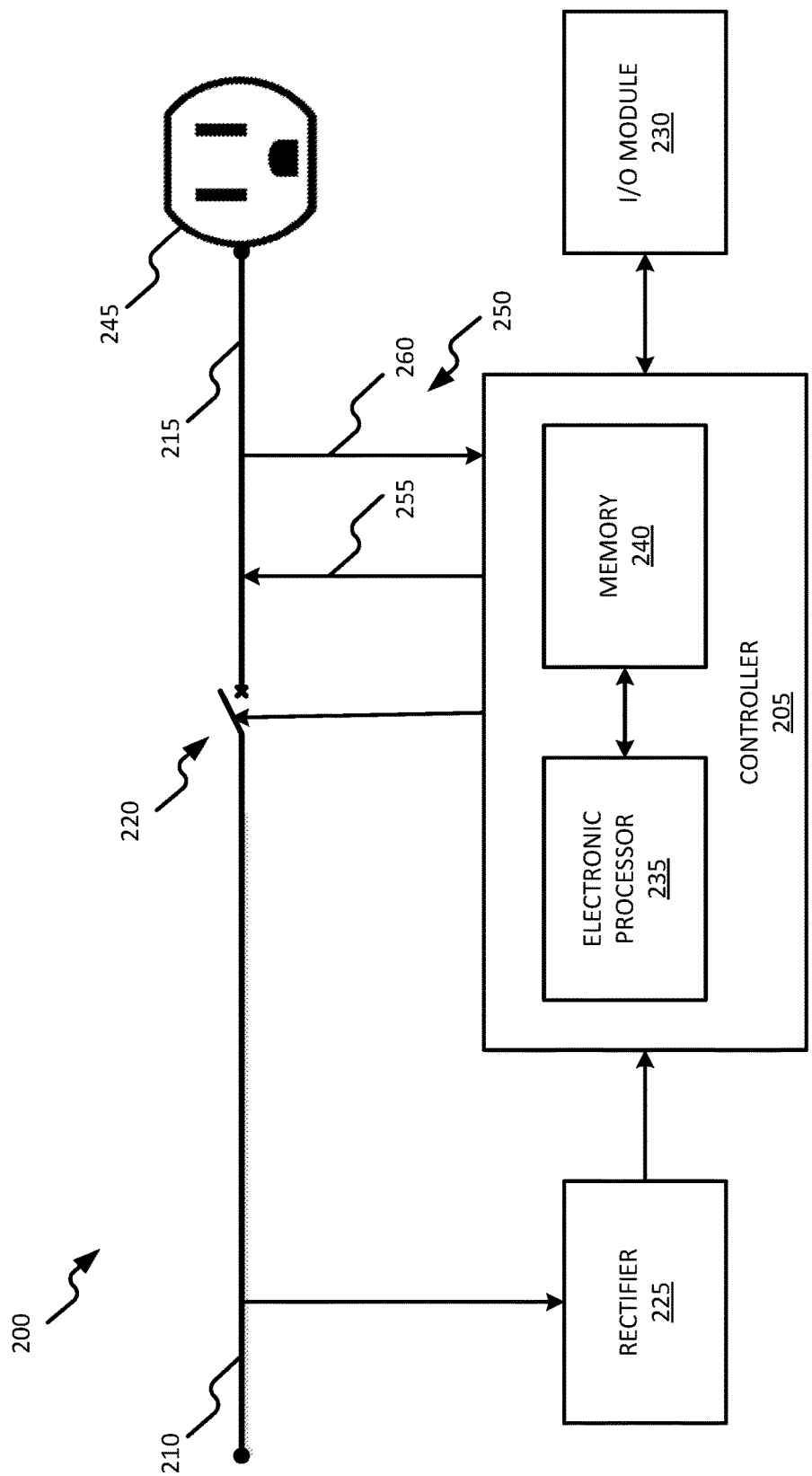
FIG. 4 is a block diagram of a testing circuit of the electrical receptacle of FIG. 1 according to some embodiments.

FIG. 3 is a side elevation view of a core assembly 80 according to some embodiments. Core assembly 80 includes a circuit board, such as a printed-circuit board (PCB), 82 that supports most of the working components of the receptacle 10, including the control system 200 (FIG. 4). Line contact arms 94, 96 pass through transformers 425, 430 with an insulating separator 97 there between. Line contact arms 94, 96 are cantilevered, their respective distal ends carrying phase and neutral line contacts 102, 104. Load contact arms 98, 100 are also cantilevered with their respective distal ends carrying phase and neutral load contacts 101, 103. The resiliency of the cantilevered contact arms biases the line contacts 102, 104 and load contacts 101, 103 away from each other. Load contact arms 98, 100 rest on a movable contact carriage 106, made of insulating (preferably thermoplastic) material.

FIG. 4 is a block diagram illustrating a testing circuit, or control system 200. The control system 200 includes a controller 205. The controller 205 is electrically and/or communicatively connected to a variety of modules or components of the receptacle 10. For example, the controller 205 is connected to a line terminal 210, a load terminal 215, an interrupting device 220, a rectifier 225, and an input/output (I/O) module 230.

In some embodiments, the controller 205 includes a plurality of electrical and electronic components that provide power, operational control, and protection to the components and modules within the controller 205 and/or the receptacle 10. For example, the controller 205 includes, among other things, an electronic processor 235 (for example, a microprocessor or another suitable programmable device) and the memory 240.

The memory 240 includes, for example, a program storage area and a data storage area. The program storage area and the data storage area can include combinations of different types of memory, such as read-only memory (ROM), random access memory (RAM), Various non-transitory computer readable media, for example, magnetic, optical, physical, or electronic memory may be used. The electronic processor 235 is communicatively coupled to the memory 240 and executes software instructions that are stored in the memory 240, or stored on another non-transitory computer readable medium such as another memory or a disc. The software may include one or more applications, program data, filters, rules, one or more program modules, and other executable instructions.

The line terminal 210 is configured to receive a line power. The line terminal 210 is selectively electrically connected, via the interrupting device 220, to the load terminal 215. The load terminal 215 is configured to output the line power to an external load electrically connected to an outlet 245. In some embodiments, the outlet 245 includes the duplex outlet face 14 with the phase opening 16, the neutral opening 18, and the ground opening 20.

The interrupting device 220 is configured to interrupt the flow of line power from the line terminal 210 to the load terminal 215. In some embodiments, the interrupting device 220 may include components of the core assembly 80, for example line contact arms 94, 96, transformers 425, 430, contacts 102, 104, load contact arms 98, 100, and contacts 101, 103. In other embodiments, the interrupting device 220 includes a separate electrical switch from the line contact arms 94, 96, transformers 425, 430, contacts 102, 104, load contact arms 98, 100, and contacts 101, 103. In such an embodiment, the separate electrical switch may be located between the line terminal 210 and the line contact arms 94, 96, transformers 425, 430, contacts 102, 104, load contact arms 98, 100, and contacts 101, 103. In another embodiment, the separate electrical switch may be located between the load terminal 215 and the line contact arms 94, 96, transformers 425, 430, contacts 102, 104, load contact arms 98, 100, and contacts 101, 103. In yet another embodiment, the separate electrical switch may be located between the load terminal 215 and the outlet 245.

Although illustrated as a single line terminal 210, a single load terminal 215, and single interrupting device 220, in other embodiments, the receptacle 10 may include two or more individually functioning line terminals 210, load terminals 215, and interrupting devices 225. For example, a first line terminal, a first load terminal, and a first interrupting device may correspond to a first outlet of the receptacle 10, while a second line terminal, a second load terminal, and a second interrupting device may correspond to a second outlet of the receptacle 10.

The rectifier 225 is configured to rectify the line power to a nominal power for use by the controller 205. In some embodiments, the rectifier 225 rectifies alternating current (AC) power to a nominal direct current (DC) power.

The I/O module 230 is configured to provide communication between the receptacle 10 and outside devices (for example, other receptacles, electrical devices, external computers, smart phones, tablets, etc.). In such an embodiment, the receptacle 10 may communicate with the one or more outside devices through a network. The network is, for example, a wide area network (WAN) (e.g., the Internet, a TCP/IP based network, a cellular network, such as, for example, a Global System for Mobile Communications [GSM] network, a General Packet Radio Service [GPRS] network, a Code Division Multiple Access [CDMA] network, an Evolution-Data Optimized [EV-DO] network, an Enhanced Data Rates for GSM Evolution [EDGE] network, a 3GSM network, a 4GSM network, a Digital Enhanced Cordless Telecommunications [DECT] network, a Digital AMPS [IS-136/TDMA] network, or an Integrated Digital Enhanced Network [iDEN] network, etc.). In other embodiments, the network is, for example, a local area network (LAN), a neighborhood area network (NAN), a home area network (HAN), or personal area network (PAN) employing any of a variety of communications protocols, such as Wi-Fi, Bluetooth, ZigBee, etc. In yet another embodiment, the network includes one or more of a wide area network (WAN), a local area network (LAN), a neighborhood area network (NAN), a home area network (HAN), or personal area network (PAN).

In operation, the testing circuit 200 is normally in a standby mode, wherein the interrupting device 220 electrically disconnects the line terminal 210 from the load terminal 215. Accordingly, in the standby mode, power is not provided to the outlet 245 and thus, any external load that may be electrically connected to the outlet 245.

The controller 205 monitors the load terminal 215 to determine if an external load is electrically connected to the outlet 245. In some embodiments, the controller 205 monitors the load terminal 215 at a predetermined time period (for example, every 1 µs, every 1 ms, every 1 s).

When the controller 205 determines that an acceptable external load is electrically connected to the outlet 245, the testing circuit 200 is placed in an operation mode, wherein the interrupting device 220 electrically connects the line terminal 210 to the load terminal 215. Accordingly, in the operation mode, power is provided to the outlet 245 and thus to the external load electrically connected to the outlet 245.

In the illustrated embodiment, the testing circuit 200 includes a feedback loop 250 configured to monitor the load terminal 215. The feedback loop 250 includes an output 255 and an input 260. In operation, the controller 205 outputs a test signal (for example, a low-level DC voltage signal), via the output 255, to the load terminal 215. The controller 205 then receives a response signal, via the input 260, from the load terminal 215. The controller 205 analyzes the response signal to determine if an external load is electrically connected to the outlet 245. In some embodiments, the test signal is output to a phase line of the outlet 245 while the response signal is received from a neutral line of the outlet 245.

In some embodiments, an electrical characteristic (for example, a voltage, a current, a resistance, etc.) of the response signal is analyzed. In some embodiments, the electrical characteristic corresponds to the external load electrically connected to the outlet 245. For example, the electrical characteristic may correspond to a resistance of the external load.

Figure 5:
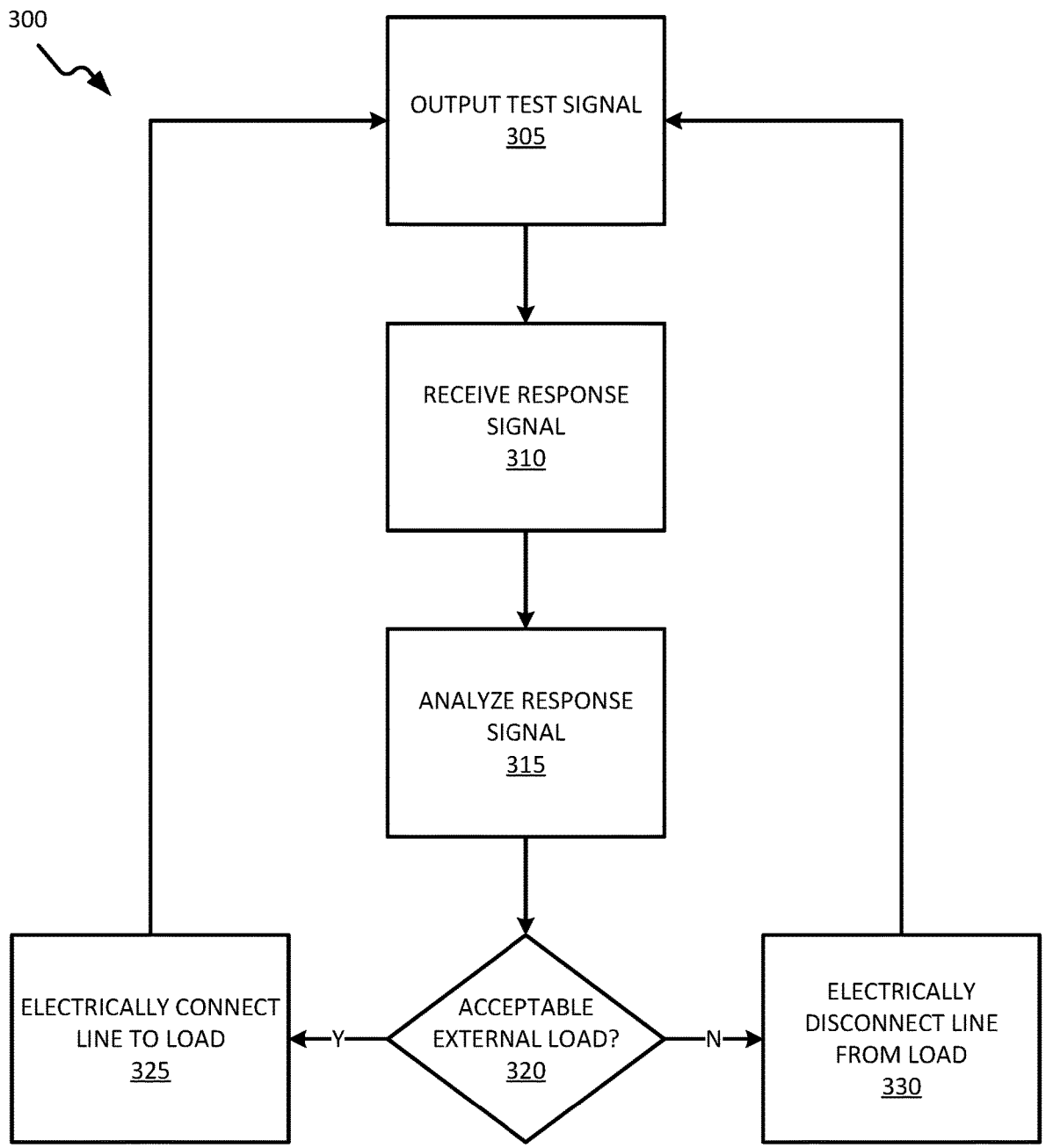
FIG. 5 is a flow chart illustrate an operation of the electrical receptacle of FIG. 1 according to some embodiments.

FIG. 5 is a flowchart illustrating a process, or operation, 300 of the receptacle 10. Operation 300 may be performed by testing circuit 200 and/or controller 205. It should be understood that the order of the steps disclosed in method 300 could vary. Additional steps may also be added to the control sequence and not all of the steps may be required. A test signal is output to the load terminal 215 (block 305). A response signal is received (block 310). The response signal is analyzed (block 315). A determination is made whether an acceptable external load is electrically connected to the outlet 245 (block 320).

If an acceptable load is electrically connected to the outlet 245, the interrupting device 220 electrically connects the line terminal 210 to the load terminal 215, thus supplying line power to the external load (block 325). Operation 300 then cycles back to block 305. If an acceptable load is not electrically connected to the outlet 245, the interrupting device 220 electrically disconnects the line terminal 210 to the load terminal 215 (block 330). Operation 300 then cycles back to block 305.

In some embodiments, the receptacle may be controlled by the outside device, via the I/O module 230. For example, a user, via the outside device (for example, a smartphone), may electrically connect/disconnect the line terminal 210 from the load terminal 215, regardless if an acceptable external load is electrically connected to the outlet 245.

Thus, the application provides, among other things, a system and method for determining when an acceptable external load is electrically connected to a receptacle and providing power to the external load accordingly. Various features and advantages of the application are set forth in the following claims.

What is claimed is:

1. An electrical receptacle comprising:
an outlet configured to electrically connect to an external load;
a load terminal electrically connected to the outlet;
a line terminal electrically connected to a line and configured to receive line power;
an interrupting device electrically connecting the load terminal to the line terminal when in a first condition and electrically disconnecting the load terminal and the line terminal when in a second condition; and
a testing circuit including a controller and a feedback loop, the feedback loop including an output and an input of the controller, the testing circuit configured to
output, via the output of the controller, a signal to a phase line of the outlet,
receive, via the input of the controller, a response signal from a neutral line of the outlet,
measure, via the controller, a resistance of the response signal,
determine, via the controller, when the external load is electrically connected to the outlet based on the resistance of the response signal, and
place the interrupting device in the first condition when the external load is electrically connected to the outlet.

2. The electrical receptacle of claim 1, wherein the signal is a voltage.

3. The electrical receptacle of claim 2, wherein the voltage is a direct current voltage.

4. A method of controlling an electrical receptacle including an outlet, a testing circuit having a controller and a feedback loop, the feedback loop including an output and an input of the controller, the method comprising:
outputting, via the output of the controller, a test signal to a phase line of the outlet;
receiving, via the input of the controller, a response signal from a neutral line of the outlet;
measuring, via the controller, a resistance of the response signal;
determining, via the controller and based on the resistance of the response signal, if an acceptable external load is electrically connected to an outlet; and
controlling an interrupting device based on the determination.

5. The method of claim 4, wherein the test signal is output to at least one selected from the group consisting of a load terminal and the outlet.

6. The method of claim 4, wherein the interrupting device is configured to electrically connect the line terminal to the load terminal.

* * * * *